CLIPPER AMPLIFIER CIRCUIT

Filed Feb. 20, 1967

INVENTORS
RICHARD K. HARTIN
WESTLEY W. SMITH
BY Moody & Anderson
AGENTS

United States Patent Office
3,413,562
Patented Nov. 26, 1968

3,413,562
CLIPPER AMPLIFIER CIRCUIT

Richard K. Hartin, Plano, and Westley W. Smith, Garland, Tex., assignors to Collins Radio Company, Cedar Rapids, Iowa, a corporation of Iowa Filed Feb. 20, 1967, Ser. No. 617,229
8 Claims. (Cl. 330—17)

ABSTRACT OF THE DISCLOSURE

This invention relates generally to a signal amplifying and limiting circuitry and more particularly to an improved signal clipping circuit of the type employing a signal amplifying device in which clipping is effected by driving signal translating devices to "off," or nonconductive, condition as opposed to being driven into saturation.

Figure 1:
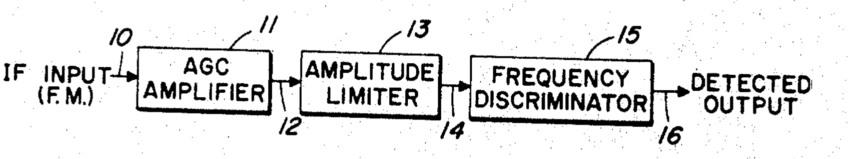
FIG 1 PRIOR ART

In frequency modulation receiving systems the modulated IF signal generated at the receiver is generally applied to an automatic gain control amplifier the output of which is at a constant level over a wide dynamic range of input signal magnitude. The signal is then applied to a limiter. The amplitude limited signal is applied to a discriminator to recover the modulation signal. Amplitude limiting is included to obtain the advantage of clipping amplitude noise perturbations which normally appear on a frequency modulation signal. In order that the amplitude limiter may effectively operate, the input signal must be applied to an automatic gain control circuitry to insure that the amplitude of the signal as applied to the limiter, is sufficient to insure limiting, even though the input signal may vary in amplitude over a considerable range.

High quality IF amplifiers employing AGC along with amplitude limiting prior to detection are generally difficult to design and expensive.

In high frequency applications, a particular problem exists when solid state circuitry is to be employed, because saturation limiting techniques may introduce response time problems. When semiconductors are employed as saturation limiters, the semiconductor junction actually becomes charged to some finite value when driven to and beyond the saturation point, and a finite time is involved for recovery. Thus, in the design of high frequency circuits employing amplitude limitation, the employment of semiconductors introduces a response time problem with a resulting loss of symmetry as concerns symmetrical clipping operations.

An object therefore of the present invention is the provision of a clipper amplifier circuitry employing transistors wherein clipping is effected by driving transistors to an "off" condition, as opposed to being driven to saturation.

Another object of the present invention is the provision of a solid state clipper amplifier circuitry adaptable for microminiaturization.

A further object of the present invention is the provision of a clipper amplifier circuitry which may be used repetitively in a given construction and provide for a selective adjustment of both the over-all circuit gain and clipping level such that the arrangement may be used to combine AGC and amplitude limiting functions as normally employed.

A still further object of the present invention is the provision of a solid state clipper amplifier circuitry capable of providing symmetrical limiting of an input signal at higher operating frequencies than is possible with use of conventional saturation limiters.

The present invention is featured in the provision of a circuit which may be used repetitively in cascade, each circuit employing a complementary pair of emitter followers combined with an amplifying stage wherein each of the pair of emitter followers effects clipping by cut-off at a preselected level.

Figure 2:
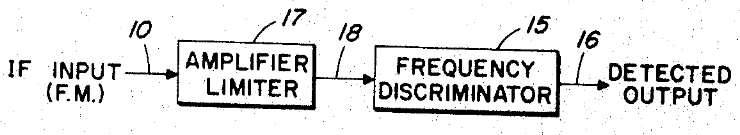
Figure 3:
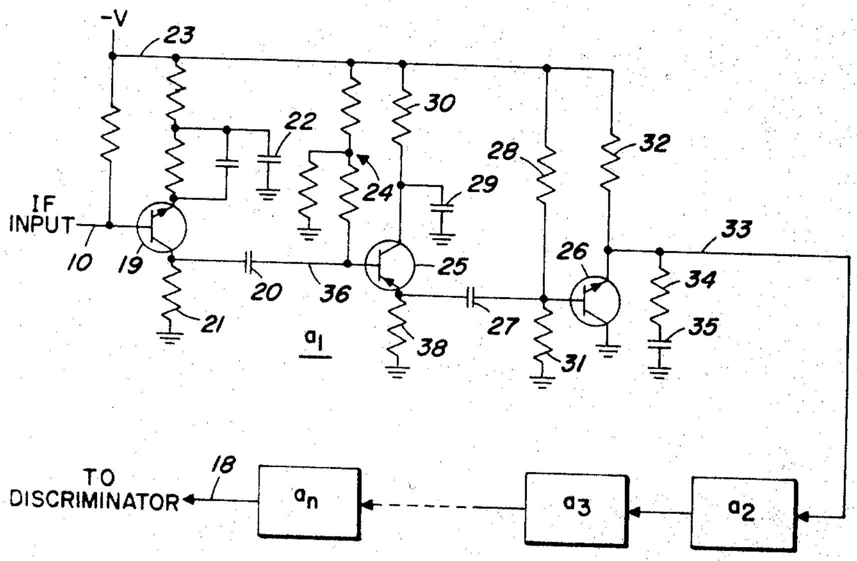

These and other features and objects of the present invention will become apparent upon reading the following description in conjunction with the attached drawings in which:

FIGURE 1 is a functional diagram of a conventional IF amplifier arrangement employing automatic gain control, amplitude limitation and detection;

FIGURE 2 is a functional block diagram of a system in accordance with the present invention wherein the functions of the normal AGC amplifier and amplitude limiter are replaced by a combination amplifier-limiter circuitry in accordance with the present invention; and FIGURE 3 is a functional schematic diagram illustrating the embodiment of the amplifier limiter in accordance with the present invention, a plurality of which may be cascaded to form a combination AGC amplifier and limiter.

The present invention generally provides an amplitude signal limiting device employing solid state circuitry which is capable of symmetrical signal limiting at high operating frequencies.

The present invention overcomes the response time problems introduced by saturation techniques by effecting limiting cut-off of solid state devices rather than by saturation thereof. As a result, the circuitry of the present invention provides symmetrical limiting at considerably higher operating frequencies than circuits employing conventional saturation techniques.

FIGURE 1 illustrates conventional operations employed in frequency modulation receivers wherein the IF input signal 10 is applied to an AGC amplifier 11 such that the output 12 from the AGC amplifier 11 is at a constant amplitude over a wide range of input signal amplitudes. The output 12 from amplifier 11 is applied to an amplitude limiter 13 to remove amplitude noise perturbations which may be present. The amplitude limiter 13 limits at some level less than the level of the AGC amplifier output. The limited signal 14 is then applied to a discriminator for the purpose of detecting the frequency modulation.

FIGURE 2 illustrates an improved circuitry in accordance with the present invention in which the IF input signal 10 is applied to an amplifier limiter 17 with the output 18 from the amplitude-limiter being applied to the discriminator 15. The amplifier limiter 17 of FIGURE 2 combines the functions of the AGC amplifier 11 and the amplitude limiter 13 of the conventional arrangement of FIGURE 1.

With reference to FIGURE 3, the amplifier-limiter of FIGURE 2 is illustrated as a cascaded arrangement of a plurality of clipper-amplifier circuits $a_1, a_2, a_3 \ldots a_n$. The IF input signal 10 is applied as input to the first clipper amplifier $a_1$. The output 33 from clipper amplifier $a_1$ is applied as input to the subsequent clipper amplifier $a_2$ etc., with an output 18 from the amplifier-limiter being taken as the output from the final one ($a_n$) of the clipper-amplifier stages, it being understood that the output 18 would then be applied to a discriminator as functionally depicted in FIG. 2.

Clipper amplifier $a_1$ of FIGURE 3 is shown in full schematic detail, it being understood that the succeeding stages, $a_2, a_3 \ldots a_n$ would be of like configuration.

With reference to FIGURE 3, the basic figure amplifier circuit $a_1$ is comprised of an input amplification stage followed by a complementary clipper comprised of a complementary pair of emitter followers.

The input amplification stage comprises a transistor 19 in a common-emitter configuration. Input signal 10 is applied to the base of transistor 19. The collector of transistor 19 is connected through resistance 21 to ground, while the emitter and base electrodes, are connected through appropriate bias resistors to a negative voltage source 23. RF signal bypass in the emitter circuit is effected by capacitor 22 to common ground. An output is taken from the collector of transistor 19 and coupled through capacitor 20 as input to the first of the complementary emitter followers. Amplifier output 36 is an inverted and amplified function of the input signal 10. The output 36 from the amplifier 19 is applied as input to the base of a type PNP transistor 25 which is connected in a common-collector (emitter follower) configuration. The base of transistor 25 is connected to the negative voltage supply 23 through an appropriate resistive network 24. The collector of transistor 25 is returned through resistance 30 to the negative voltage source while capacitor 29 provides a ground return for signal frequencies. The emitter of transistor 25 is connected through a resistor 38 to ground. The signal developed across the resistor 38 is coupled through capacitor 27 as input to the second one of the pair of emitter followers which comprises a type NPN transistor 26. The base of transistor 26 is connected through resistors 28 and 31 to the negative voltage supply 23 and common ground respectively. The collector of transistor 26 is grounded directly. The emitter of transistor 26 is connected through resistance 32 to the negative supply source 23 and, through resistance 34 and RF bypass capacitor 35, to ground. The output 33 from the clipper amplifier circuitry is the voltage on the emitter of transistor 26.

In operation, the IF input signal 10 supplies an inverted and amplified signal 36 to the base of transistor 25. As the amplitude of the positive peaks as applied to the base of transistor 25 reaches a predetermined level, the emitter current rises until the voltage developed across the emitter resistor 38 biases off the emitter-base junction of transistor 25. As this point is reached, the transistor 25 can no longer conduct, there is no current flow through the emitter resistor 38, and the output is clipped at ground level. Negative peaks of the signal 36 as applied to the base of PNP transistor 35 do not effect transistor cut-off.

The voltage across the emitter resistor 38 of transistor 25 is coupled through capacitor 27 as input to the second transistor of the complementary pair such that negative peaks of the signal, as applied to the base of transistor 26, are clipped when the amplitude of the negative peaks reaches a level such that the voltage drop across the emitter resistor 34 of transistor 26 biases off the emitter-base junction to cut off the transistor. The emitter resistors of the complementary pair, resistors 38 and 34, may be chosen as equal resistances whereupon the output 33 from the second stage of the complementary pair is a symmetrical clipped wave. The positive peaks of the signal applied to the base of transistor 25 are thus seen to be clipped at a level established by the value of the emitter resistance 38, while the negative peaks of the signal, as applied to transistor 25, since there is no phase inversion through the emitter follower 25, are clipped by the emitter follower 26 at a level established by resistor 34. In each case, the clipping is seen to be effected by cut-off of the associated transistor. Symmetrical limiting is therefore realized without the common practice of driving stages into saturation, which as above described, would introduce response time problems, particularly when the circuit is to be operative at high frequencies such as, for example, seventy megacycles.

The gain of the clipper amplifier circuit $a_1$ is established by design of the input amplification stage, and the clipping levels are established by the values of the emitter resistors 38 and 34 as respectively employed in the complementary pair of emitter followers. A cascaded arrangement of circuitries such as above-defined may be employed in an over-all combination AGC amplifier and limiter circuit. The collective gain of the successive clipper-amplifiers $a_1, a_2, a_3 \ldots a_n$ may be chosen to assure limiting over a wide dynamic range of input signals. In an actual embodiment, clipping over a dynamic input range may be effected in successively different ones of the stages $a_1 \ldots a_n$ that is, an extremely low amplitude input signal 10 may not be clipped in the first stage, but, due to the cascaded arrangement, a progressive increase in gain may be realized and clipping may be effected further on down the cascaded arrangement. In an embodiment which was caused to be constructed, the over-all gain of a plurality of seven circuits such as circuit $a_1$, was chosen such that the over-all circuit would provide symmetrical clipping on noise alone. The over-all function is thus seen to include that of an AGC amplifier, in that the output 18 may be established at a fixed amplitude defined by the chosen clipping level, regardless of the amplitude of the input signal 10.

The clipper-amplifier of the present invention is thus seen to provide a simple circuitry which provides symmetrical clipping function without resorting to saturation techniques and thus permits operation at higher frequency ranges. The over-all circuitry is arrived at by a cascaded arrangement of the basic circuit, thus simplifying construction techniques and maintainability. The circuitry employs no transformers and is thus adaptable for microminiaturization techniques. Since the basic circuit operates on a cut-off feature, symmetrical limiting may be realized without precise matching of the complementary transistors. The transistors are employed in emitter follower configurations, the gain is thus inherently less than unity, and the clipping levels may be quite satisfactorily set for symmetrical operation by inclusion of like-value emitter resistors in each of the emitter follower configurations.

Although the present invention has been described with respect to a particular embodiment thereof it is not to be so limited as changes may be made therein which fall within the spirit and scope of the invention as defined by the appended claims.

We claim:

1. A combination clipper and amplifier circuit comprising an amplifier stage to which an input alternating current signal is to be applied, said amplifier providing a predetermined gain, the output from said amplifier connected to and driving a first signal translating stage the gain of which is less than unity, said first signal translating stage being driven to a nonconductive state upon the input signal thereto exceeding a predetermined amplitude of a first polarity whereby signal peaks of said first polarity are clipped, the output from said first signal translating stage being applied to a second signal translating stage as input thereto, said second signal translating stage being driven into a nonconductive state upon the unclipped peaks of the input signal thereto exceeding a second predetermined amplitude.

2. A circuit as defined in claim 1 wherein said first and second predetermined signal clipping amplitudes are equal and the output from said second signal translating stage is an amplified and symmetrically clipped function of said input alternating current signal.

3. A circuit as defined in claim 1 wherein said signal amplifying stage comprises a common-emitter transistor amplifier, and said first and second signal translating stages comprise a complementary pair of emitter followers.

4. A circuit as defined in claim 3 wherein the first one of said pair of emitter followers comprises a type PNP transistor, the emitter of which is connected through a predetermined load resistance whereby the positive peaks of the signal developed across said emitter load resistor are limited at a predetermined voltage level, the voltage across said emitter load resistor being connected as input to the second one of said emitter followers, the second one of said pair of emitter followers comprising a type NPN transistor, the emitter of said NPN transistor connected through a further predetermined load resistance, and an output taken across said further load resistance the negative voltage peaks of which are limited at a predetermined voltage level, and the gain of said common emitter amplifier developing an output signal from said amplifier the magnitude of which exceeds the predetermined clipping levels as established respectively by said complementary pair of emitter followers.

5. A circuit as defined in claim 3 wherein the values of the load resistances associated with each of said emitter followers are selected to establish equal clipping levels, whereby the output from said second emitter follower is a symmetrically clipped signal.

6. A circuit comprising a predetermined plurality of clipper-amplifier circuits connected in cascade, each said clipper amplifier circuit comprising a common emitter amplifier followed by a complementary pair of emitter followers, the first one of said pair of emitter followers comprising a type PNP transistor, the emitter of which is connected through a predetermined load resistance whereby the positive peaks of the signal developed across said emitter load resistor are limited at a predetermined voltage level, the voltage across said emitter load resistor being connected as input to the second one of said emitter followers, the second one of said pair of emitter followers comprising a type NPN transistor, the emitter of said NPN transistor connected through a further predetermined load resistance and an output taken across said further load resistance the negative voltage peaks of which are limited at a predetermined voltage level, said input alternating current signal applied to the common emitter amplifier of the first one of said circuits and an output taken from the second one of the complementary pair of emitter followers comprising the last one of said circuitries connected in cascade, each of said common emitter amplifiers providing a predetermined gain whereby the over-all gain of said cascaded arrangement establishes clipping of said input signal over a predetermined amplitude range of input signal amplitudes, whereby said cascaded arrangement of circuitries develops a limited output of predetermined magnitude for any input signal within said predetermined input signal amplitude range.

7. A circuit as defined in claim 6 wherein the over-all gain of said common emitter amplifiers associated with the cascaded arrangement of circuits is such that the output from the last one of said stages is clipped noise signal of predetermined amplitude in the absence of an input signal to said cascaded arrangement.

8. A clipper amplifier circuit as defined in claim 7 wherein the respective pairs of emitter followers comprising each successive complementary pair of emitter followers is adapted to limit the input signal applied to the pair at equal positive and negative output amplitude levels.

References Cited

UNITED STATES PATENTS

| | | | |
|---|---|---|---|
| 3,172,051 | 3/1965 | Baron et al. | 330—17 |
| 3,319,176 | 5/1967 | Guisinger | 330—29 X |

ROY LAKE, *Primary Examiner.*

SIEGFRIED H. GRIMM, *Assistant Examiner.*